(12) United States Patent
Venkataraman et al.

(10) Patent No.: US 8,610,874 B2
(45) Date of Patent: Dec. 17, 2013

(54) PULSE STRETCHER WITH REDUCED ENERGY DENSITY ON OPTICAL COMPONENTS

(75) Inventors: Arun Mahadevan Venkataraman, Norwalk, CT (US); Jonathan Rodney, White Plains, NY (US)

(73) Assignee: ASML Holding N.V., Veldhoven (NL)

( * ) Notice: Subject to any disclaimer, the term of this patent is extended or adjusted under 35 U.S.C. 154(b) by 559 days.

(21) Appl. No.: 12/768,096

(22) Filed: Apr. 27, 2010

(65) Prior Publication Data

US 2010/0302522 A1   Dec. 2, 2010

Related U.S. Application Data

(60) Provisional application No. 61/181,121, filed on May 26, 2009.

(51) Int. Cl.
*G03B 27/42* (2006.01)

(52) U.S. Cl.
USPC .............. 355/53; 355/63; 355/67; 355/77

(58) Field of Classification Search
USPC .......... 355/53, 63, 67, 77; 359/618; 353/122; 362/3, 268; 372/22, 25, 700
See application file for complete search history.

(56) References Cited

U.S. PATENT DOCUMENTS

| | | | |
|---|---|---|---|
| 6,535,531 B1 * | 3/2003 | Smith et al. ...................... 372/25 |
| 6,549,267 B1 * | 4/2003 | Kudo ............................... 355/53 |
| 7,321,468 B2 | 1/2008 | Herkommer et al. | |
| 7,432,517 B2 | 10/2008 | Botma et al. | |
| 2006/0216037 A1 | 9/2006 | Wiessner et al. | |
| 2007/0258709 A1 * | 11/2007 | Gesner et al. .................. 396/114 |

FOREIGN PATENT DOCUMENTS

| | | |
|---|---|---|
| CN | 1910489 A | 2/2007 |
| WO | WO 2005/073771 A | 8/2005 |

\* cited by examiner

*Primary Examiner* — Steven H Whitesell Gordon
*Assistant Examiner* — Mesfin T Asfaw
(74) *Attorney, Agent, or Firm* — Sterne, Kessler, Goldstein & Fox P.L.L.C.

(57) ABSTRACT

A pulse stretcher includes a beam splitter configured to split an input light beam into first and second beams, a con-focal resonator including first and second con-focal mirrors, and a fold mirror. The beam splitter, con-focal resonator, and fold mirror are optically arranged such that at least a portion of the first beam is recombined with the second beam into a modified beam after an optical delay of the first beam caused by the optical arrangement. The apparatus further includes one or more optical elements in an optical path of the input light beam prior to the beam splitter such that a focal point of the first beam is formed at a distance away from the fold mirror preventing energy density-related damage to the fold mirror. The apparatus can further include one or more additional optical elements to provide re-conditioning of the modified beam. A related method is also disclosed.

17 Claims, 10 Drawing Sheets

PULSE STRETCHER WITH REDUCED ENERGY DENSITY ON OPTICAL COMPONENTS

CROSS REFERENCE TO RELATED APPLICATIONS

This patent application claims the benefit of U.S. Provisional Patent Application No. 61/181,121 filed on May 26, 2009, entitled "Pulse Stretcher With Reduced Energy Density On Optical Components", which is incorporated by reference herein in its entirety.

BACKGROUND

1. Field of the Invention

The present invention relates to systems and methods for optical pulse stretching.

2. Background Art

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, may be used to generate a circuit pattern to be formed on an individual layer of the IC. This pattern can be transferred onto a target portion (e.g., including part of, one, or several dies) on a substrate (e.g., a silicon wafer). Transfer of the pattern is typically via imaging onto a layer of radiation-sensitive material (resist) provided on the substrate. In general, a single substrate will contain a network of adjacent target portions that are successively patterned. Known lithographic apparatus include so-called steppers, in which each target portion is irradiated by exposing an entire pattern onto the target portion at one time, and so-called scanners, in which each target portion is irradiated by scanning the pattern through a radiation beam in a given direction (the "scanning"-direction) while synchronously scanning the substrate parallel or anti-parallel to this direction. It is also possible to transfer the pattern from the patterning device to the substrate by imprinting the pattern onto the substrate.

A lithographic apparatus can include an illumination system (illuminator) configured to condition a radiation beam (e.g., DUV or EUV radiation). The illumination system can include various types of optical components, such as refractive, reflective, magnetic, electromagnetic, electrostatic or other types of optical components, or any combination thereof, for directing, shaping, or controlling radiation. The illumination system receives a radiation beam from a radiation source. In some systems, a radiation beam passes from the radiation source to the illumination system with the aid of a beam delivery system that can include, for example, suitable directing mirrors and/or a beam expander. The radiation source and illumination system, together with a beam delivery system, if required, may be referred to as a radiation system.

A lithographic apparatus can include large expensive lens elements that are difficult to fabricate. Typically, an excimer laser is used to supply the lithographic apparatus with radiation in the form of pulses. The expensive lens elements are subject to degradation resulting from billions of these high intensity ultraviolet pulses. Optical damage is known to increase with increasing irradiance (i.e., light power (energy/time) per $cm^2$ or $mJ/ns/cm^2$) of the pulses from the laser. The typical pulse length from these lasers is about 20 ns, so a 5 mJ laser pulse would have a pulse power of about 0.25 mJ/ns (0.25 MW). Increasing the pulse energy to 10 mJ without changing the pulse duration would result in a doubling of the power of the pulses to about 0.5 mJ/ns that could significantly shorten the usable lifetime of the lens elements.

Pulse stretching devices have been used to avoid potential optical damage by substantially increasing the pulse length (e.g., from about 20 ns to more than 50 ns) providing a reduction in the rate of optics degradation. A pulse stretching device (pulse stretcher) increases the temporal pulse length of a laser by creating copies of a laser pulse and separating them in time by an optical delay. In lithography, pulse stretchers are mainly used to increase the lifetime of optics. In addition, increasing temporal delay helps to reduce speckle. Speckle is the optical interference between beams due to temporal and spatial coherence. Superimposing portions of a beam with different time delays reduces coherence and speckle. A pulse stretcher is typically located just after the laser, or in a beam delivery system. Further information regarding pulse stretchers can be found in U.S. Pat. No. 7,432,517 B2, which is incorporated herein by reference in its entirety.

Some pulse stretcher designs use con-focal resonators, in which a pulse (also referred to in this document as a beam) is approximately collimated upon entry and exit, but passes through an intermediate focal point inside the pulse stretcher. In an unfolded implementation, e.g., where no fold mirrors are used to redirect the beam, the intermediate focal point likely causes no damage to nearby optics as it is located away from optical surfaces. Packaging constraints for longer pulse stretching, however, may require the use of fold mirrors to bend the pulse stretcher cavity into two or more parts. The insertion of one or more fold mirrors results in an optical surface where none existed in the unfolded implementation. If a fold mirror is too near the intermediate focal point, which is likely when maximizing pulse stretcher delay and making use of available space, an unacceptably high irradiance may strike the mirror. The resulting damage or a decrease in usable lifespan of the mirror due to the high energy density upon the mirror's surface is sought to be avoided.

BRIEF SUMMARY OF THE INVENTION

It is desirable to reduce or prevent damage to optics caused by a laser beam's high energy density at a focal point in a folded pulse stretching device.

Embodiments of the present invention relate to systems and methods for increasing temporal pulse length of a laser pulse, in particular a laser pulse of a laser used in a lithography system. Embodiments of the present invention have particular relevance to the reduction of energy density on optical components used in or with a pulse stretching and/or lithography apparatus.

According to an embodiment, apparatus (e.g., a pulse stretcher or pulse modifier) includes a beam splitter configured to split an input light beam into a first beam and a second beam, a con-focal resonator including a first con-focal mirror and a second con-focal mirror, and a fold mirror. In this embodiment, the fold mirror is in an optical path between the first and second con-focal mirrors, and the beam splitter, the con-focal resonator, and the fold mirror are in an optical arrangement such that at least a portion of the first beam is recombined with the second beam into a modified beam after an optical delay of the first beam caused by the optical arrangement. This embodiment further includes one or more optical elements in an optical path of the input light beam prior to the beam splitter. The one or more optical elements can change the input light beam to a diverging or converging state, for example, such that an intermediate focal point of the first beam is formed at a distance away from the fold mirror preventing energy density-related damage to the fold mirror. In an embodiment, the pulse stretcher further includes one or more additional optical elements in an optical path of the modified beam to re-condition the modified beam.

In an embodiment, the one or more optical elements provide divergence of the input light beam prior to the splitting of the input light beam by the beam splitter. In an alternative embodiment, the one or more optical elements provide convergence of the light beam prior to the splitting of the input light beam by the beam splitter.

In an embodiment, the pulse stretcher further includes additional beam splitters in series with the beam splitter to provide further optical delay.

According to a further embodiment, a lithography apparatus includes a beam delivery system having a pulse stretcher according to the embodiments described above. In an embodiment, the lithography apparatus further includes an illumination system configured to condition the modified beam, a patterning device support constructed to support a patterning device, with the patterning device capable of imparting the modified beam with a pattern in its cross-section to form a patterned radiation beam, a substrate support constructed to hold a substrate, and a projection system configured to project the patterned radiation beam onto a target portion of the substrate.

According to a further embodiment, a method of increasing a pulse length of a pulsed laser beam includes diverging or converging an input light beam into an altered light beam, splitting the altered light beam into a first beam and a second beam such that the first beam is directed to travel through a pulse stretching device having a plurality of optical elements, and recombining at least a portion of the first beam and the second beam into a recombined beam. In this embodiment, the diverging or converging of the input light beam provides an intermediate focal point of the first beam located at a distance away from any of the plurality of optical elements such that energy density-related damage to any of the plurality of optical elements is prevented. In an embodiment, the method further includes re-conditioning the recombined beam.

Further features and advantages of the invention, as well as the structure and operation of various embodiments of the invention, are described in detail below with reference to the accompanying drawings. It is noted that the invention is not limited to the specific embodiments described herein. Such embodiments are presented herein for illustrative purposes only. Additional embodiments will be apparent to persons skilled in the relevant art(s) based on the teachings contained herein.

BRIEF DESCRIPTION OF THE DRAWINGS/FIGURES

The accompanying drawings, which are incorporated herein and form part of the specification, illustrate the present invention and, together with the description, further serve to explain the principles of the invention and to enable a person skilled in the relevant art(s) to make and use the invention.

The features and advantages of the present invention will become more apparent from the detailed description set forth below when taken in conjunction with the drawings, in which like reference characters identify corresponding elements throughout. In the drawings, like reference numbers generally indicate identical, functionally similar, and/or structurally similar elements. The drawing in which an element first appears is indicated by the leftmost digit(s) in the corresponding reference number.

DETAILED DESCRIPTION OF THE INVENTION

The disclosed embodiments merely exemplify the invention. The scope of the invention is not limited to the disclosed embodiments. The invention is defined by the claims appended hereto.

The embodiments described, and references in the specification to "one embodiment", "an embodiment", "an example embodiment", etc., indicate that the embodiments described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is understood that it is within the knowledge of one skilled in the art to effect such feature, structure, or characteristic in connection with other embodiments whether or not explicitly described.

Embodiments of the invention may be implemented in hardware, firmware, software, or any combination thereof. Embodiments of the invention may also be implemented as instructions stored on a machine-readable medium, which may be read and executed by one or more processors. A machine-readable medium may include any mechanism for storing or transmitting information in a form readable by a machine (e.g., a computing device). For example, a machine-readable medium may include read only memory (ROM); random access memory (RAM); magnetic disk storage media; optical storage media; flash memory devices; electrical, optical, acoustical or other forms of propagated signals (e.g., carrier waves, infrared signals, digital signals, etc.), and others. Further, firmware, software, routines, and instructions may be described herein as performing certain actions. However, it should be appreciated that such descriptions are merely for convenience and that such actions in fact result from computing devices, processors, controllers, or other devices executing the firmware, software, routines, instructions, etc.

Before describing such embodiments in more detail, it is instructive to present an example environment in which embodiments of the present invention may be implemented.

Figure 1:
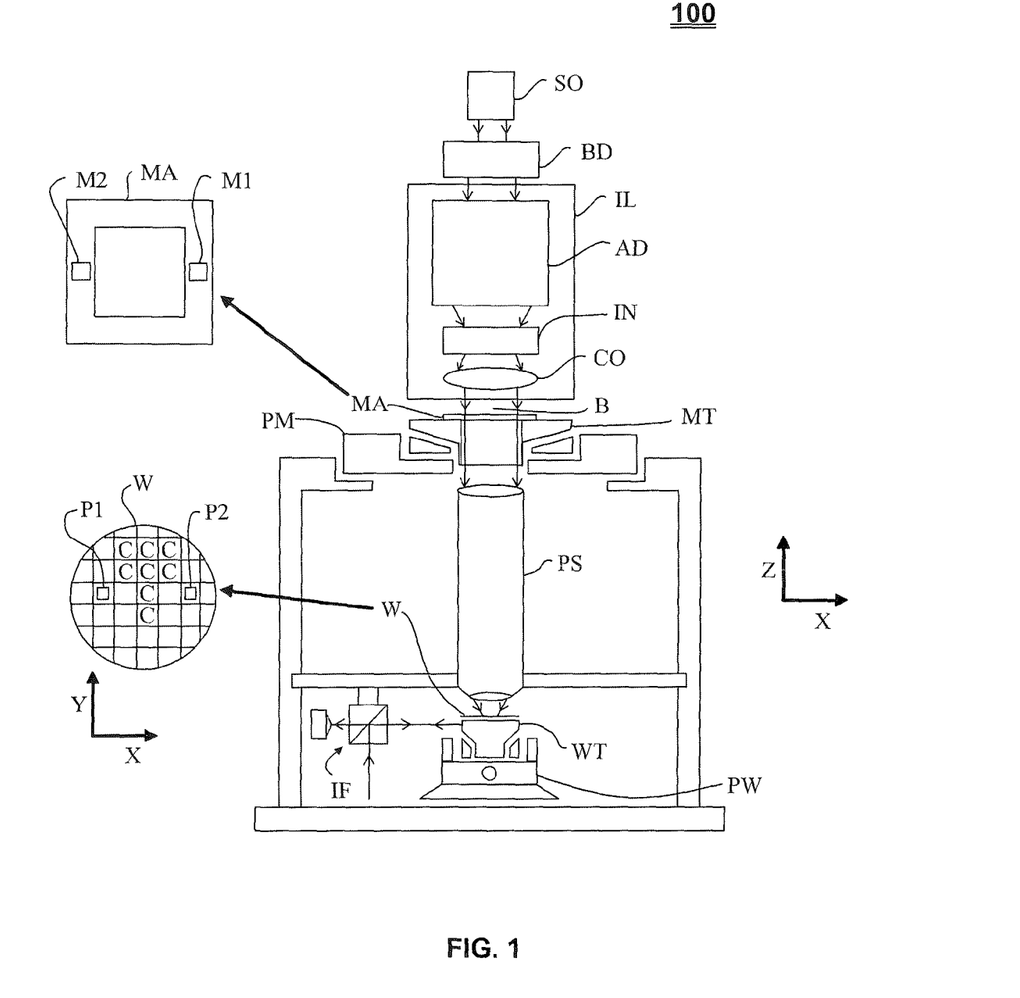
FIG. 1 depicts a lithographic apparatus that may be used in an embodiment of the present invention.

FIG. 1 schematically depicts a lithographic apparatus. The lithographic apparatus includes: an illumination system (illuminator) IL configured to condition a radiation beam B (e.g., DUV or EUV radiation); a support structure (e.g., a mask table) MT configured to support a patterning device (e.g., a mask, a reticle, or a dynamic patterning device) MA and connected to a first positioner PM configured to accurately position the patterning device MA; and a substrate table (e.g., a wafer table) WT configured to hold a substrate (e.g., a resist coated wafer) W and connected to a second positioner PW configured to accurately position substrate W. The lithographic apparatus also has a projection system PS configured to project a pattern imparted to radiation beam B by patterning device MA onto a target portion (e.g., comprising one or more dies) C of substrate W. In the lithographic apparatus, patterning device MA and projection system PS are transmissive, but alternatively could be reflective.

Illumination system IL may include various types of optical components, such as refractive, reflective, magnetic, electromagnetic, electrostatic or other types of optical components, or any combination thereof, for directing, shaping, or controlling radiation B.

Support structure MT holds patterning device MA in a manner that depends on the orientation of patterning device MA, the design of the lithographic apparatus, and other conditions, such as for example whether or not patterning device MA is held in a vacuum environment. Support structure MT may use mechanical, vacuum, electrostatic or other clamping techniques to hold patterning device MA. Support structure MT may be a frame or a table, for example, which may be fixed or movable, as required. Support structure MT may ensure that the patterning device is at a desired position, for example with respect to projection system PS.

The term "patterning device" MA should be broadly interpreted as referring to any device that may be used to impart a radiation beam B with a pattern in its cross-section, such as to create a pattern in target portion C of substrate W. The pattern imparted to radiation beam B may correspond to a particular functional layer in a device being created in target portion C, such as an integrated circuit.

Patterning device MA may be transmissive or reflective. Examples of patterning devices MA include reticles, masks, programmable mirror arrays, and programmable LCD panels. Masks are well known in lithography, and include mask types such as binary, alternating phase shift, and attenuated phase shift, as well as various hybrid mask types. An example of a programmable mirror array employs a matrix arrangement of small mirrors, each of which may be individually tilted so as to reflect an incoming radiation beam in different directions. The tilted mirrors impart a pattern in radiation beam B which is reflected by the mirror matrix.

The term "projection system" PS may encompass any type of projection system, including refractive, reflective, catadioptric, magnetic, electromagnetic and electrostatic optical systems, or any combination thereof, as appropriate for the exposure radiation being used, or for other factors, such as the use of an immersion liquid or the use of a vacuum. A vacuum environment may be used for EUV or electron beam radiation since other gases may absorb too much radiation or electrons. A vacuum environment may therefore be provided to the whole beam path with the aid of a vacuum wall and vacuum pumps.

The lithographic apparatus may be of a type having two (dual stage) or more substrate tables (and/or two or more mask tables) WT. In such "multiple stage" machines, the additional substrate tables WT may be used in parallel, or preparatory steps may be carried out on one or more tables while one or more other substrate tables WT are being used for exposure.

Referring to FIG. 1, illuminator IL receives a radiation beam from a radiation source SO. Source SO and the lithographic apparatus may be separate entities, for example when source SO is an excimer laser. In such cases, source SO is not considered to form part of the lithographic apparatus, and radiation beam B passes from source SO to illuminator IL with the aid of a beam delivery system BD including, for example, suitable directing mirrors and/or a beam expander. In other cases, source SO may be an integral part of the lithographic apparatus—for example when source SO is a mercury lamp. Source SO and illuminator IL, together with beam delivery system BD, if required, may be referred to as a radiation system.

Illuminator IL may include an adjuster AD for adjusting the angular intensity distribution of the radiation beam. Generally, at least the outer and/or inner radial extent (commonly referred to as σ-outer and σ-inner, respectively) of the intensity distribution in a pupil plane of the illuminator may be adjusted. In addition, illuminator IL may include various other components, such as an integrator IN and a condenser CO. Illuminator IL may be used to condition radiation beam B, to have a desired uniformity and intensity distribution in its cross section.

Radiation beam B is incident on the patterning device (e.g., mask MA), which is held on the support structure (e.g., mask table MT), and is patterned by the patterning device. Having traversed mask MA, radiation beam B passes through projection system PS, which focuses the beam onto a target portion C of substrate W. With the aid of second positioner PW and position sensor IF (e.g., an interferometric device, linear encoder or capacitive sensor), substrate table WT can be moved accurately, e.g., so as to position different target portions C in the path of radiation beam B. Similarly, first positioner PM and another position sensor (which is not explicitly depicted) can be used to accurately position mask MA with respect to the path of radiation beam B, e.g., after mechanical retrieval from a mask library, or during a scan.

In general, movement of mask table MT may be realized with the aid of a long-stroke module (coarse positioning) and a short-stroke module (fine positioning), which form part of first positioner PM. Similarly, movement of substrate table WT may be realized using a long-stroke module and a short-stroke module, which form part of second positioner PW. In the case of a stepper (as opposed to a scanner) mask table MT may be connected to a short-stroke actuator only, or may be fixed. Mask MA and substrate W may be aligned using mask alignment marks M1, M2 and substrate alignment marks P1, P2. Although the substrate alignment marks as illustrated occupy dedicated target portions, they may be located in spaces between target portions (known as scribe-lane alignment marks). Similarly, in situations in which more than one die is provided on mask MA, the mask alignment marks may be located between the dies.

The lithographic apparatus may be used in at least one of the following modes:

1. In step mode, support structure (e.g., mask table) MT and substrate table WT are kept essentially stationary, while an entire pattern imparted to radiation beam B is projected onto a target portion C at one time (i.e., a single static exposure). Substrate table WT is then shifted in the X and/or Y direction so that a different target portion C may be exposed.

2. In scan mode, support structure (e.g., mask table) MT and substrate table WT are scanned synchronously while a pattern imparted to radiation beam B is projected onto a target portion C (i.e., a single dynamic exposure). The velocity and direction of substrate table WT relative to support structure (e.g., mask table) MT may be determined by the (de-)magnification and image reversal characteristics of projection system PS.

3. In another mode, support structure (e.g., mask table) MT is kept substantially stationary holding a programmable patterning device, and substrate table WT is moved or scanned while a pattern imparted to radiation beam B is projected onto a target portion C. A pulsed radiation source SO may be employed and the programmable patterning device is updated as required after each movement of substrate table WT or in between successive radiation pulses during a scan. This mode of operation may be readily applied to maskless lithography that utilizes a programmable patterning device, such as a programmable mirror array of a type as referred to herein.

Combinations and/or variations on the described modes of use or entirely different modes of use may also be employed.

One known type of a pulse stretcher design uses con-focal resonators, in which a pulse (also referred to in this document as a beam) is approximately collimated upon entry and exit, but passes through an intermediate focal point inside the pulse stretcher. Packaging constraints for longer pulse stretching, however, may require the use of fold mirrors to bend the pulse stretcher cavity into two or more parts. In a folded implementation, e.g., where fold mirrors are used to redirect the beam, the intermediate focal point is likely located near optical surfaces.

In a folded implementation of a pulse stretcher, insertion of one or more fold mirrors results in an optical surface where none existed in the unfolded implementation. If a fold mirror is too near the intermediate focal point, which is likely when maximizing pulse stretcher delay and making use of available space, an unacceptably high irradiance may strike the mirror. The resulting damage or a decrease in usable lifespan of the mirror due to the high energy density upon the mirror's surface is sought to be avoided.

Figure 2:
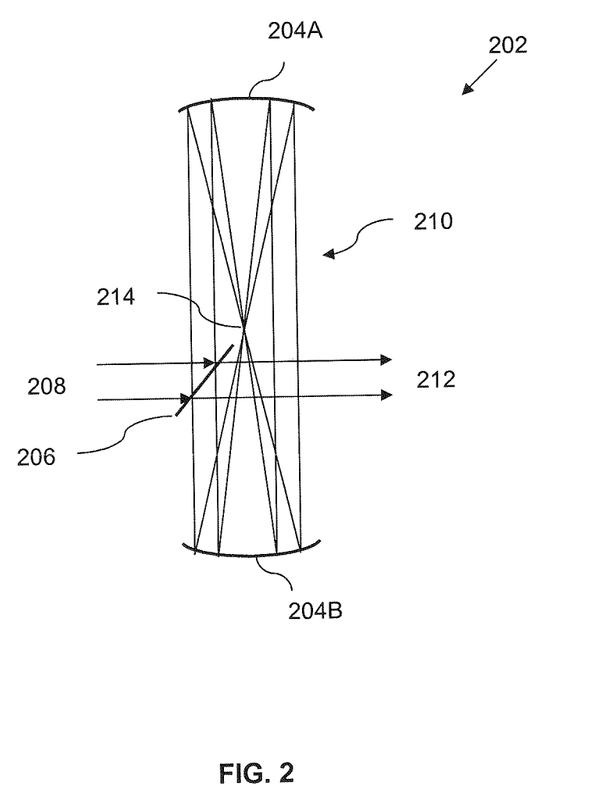
FIG. 2 depicts an exemplary pulse stretching device.

FIG. 2 depicts an exemplary pulse stretching device 202. The pulse stretching device is alternatively referred to herein as a pulse modifier or simply an apparatus. Pulse stretching device 202 includes two con-focal mirrors 204A and 204B (e.g., concave mirrors) disposed such that their reflective surfaces are facing each other. The mirrors are separated by a predetermined distance (separation), which is approximately equal to the radius of curvature of each mirror 204A/B. Each mirror 204A/B is disposed symmetrically about a mirror axis, and the longitudinal axis of each mirror is arranged to be perpendicular to the mirror axis. A second axis, parallel to the mirror axis, contacts the surface of each mirror 204A/B at a predetermined distance from the mirror axis.

A beam splitter 206 is disposed along the second axis such that the longitudinal axis of beam splitter 206 makes an angle of 45 degrees with the second axis. Beam splitter 206 is also disposed with its center on an optical axis, and the optical axis lies perpendicular to the second axis.

During operation, an input beam 208 (e.g., an approximately collimated beam, a slightly diverging beam, etc.) enters the pulse stretcher along the optical axis of beam splitter 206. An optical delay path 210 is formed by con-focal mirrors 204A and 204B. Each mirror 204A/B can be, for example, a 100 mm diameter spherical mirror with a large radius of curvature of approximately 1800 mm, separated by an optical cavity length of approximately 1800 mm. Beam splitter 206 makes a 45 degree angle with the incoming beam 208 and is disposed such that a portion of the incoming radiation 208 is reflected into the delay path 210, and such that radiation exiting the delay path 210 is reflected out of the pulse stretcher into an output radiation beam 212. If, for example a 60R/40T (60% reflection/40% transmission) beam splitter 206 is used, beam splitter 206 reflects approximately sixty (60) percent of the incoming radiation beam 208 into the delay path 210. The other approximately forty (40) percent of the transmitted portion of each pulse of beam 208 becomes a first sub-pulse of a corresponding stretched pulse in the outgoing beam 212. The reflected beam is directed by beam splitter 206 to mirror 204A, which directs the reflected portion to mirror 204B, which in turn directs it back to beam splitter 206 where approximately 60 percent of the first reflected light is reflected perfectly in line with the first transmitted portion of this pulse in outgoing beam 212 to become a second sub-pulse. Approximately forty (40) percent of the first reflected beam is transmitted by beam splitter 206 and follows the path of the first reflected beam producing additional smaller sub-pulses in the outgoing radiation beam 212.

By configuring the beam splitter transmission/reflection coefficient and varying the path lengths, the resulting outgoing beam 212 may be stretched by different degrees. For example, with a delay path 40 of approximately 7.2 m and a 50R/50T beam splitter 206, an incoming beam 208 of TIS 70 ns can be stretched into a pulse in the outgoing beam 212 with a time integral square (TIS) pulse length of 110 ns. As appreciated by one skilled in the relevant art, pulse stretcher 202 is just one example of a pulse stretching device, for which more detail can be found in U.S. Pat. No. 7,432,517 B2, which is incorporated herein by reference in its entirety. Other pulse stretcher configurations may exist that have similar functionality.

As shown in FIG. 2, pulse stretcher 202 forms a focal point 214 that, in this implementation, is approximately equidistant between con-focal mirror 204A and con-focal mirror 204B. The energy density at, or near, focal point 214 can be high, e.g., on the order of 100 mj/cm$^2$ or more. Focal point 214 can be considered an intermediate focal point in the context of a pulse stretcher's use in a larger system, such as a lithographic apparatus.

Figure 3:
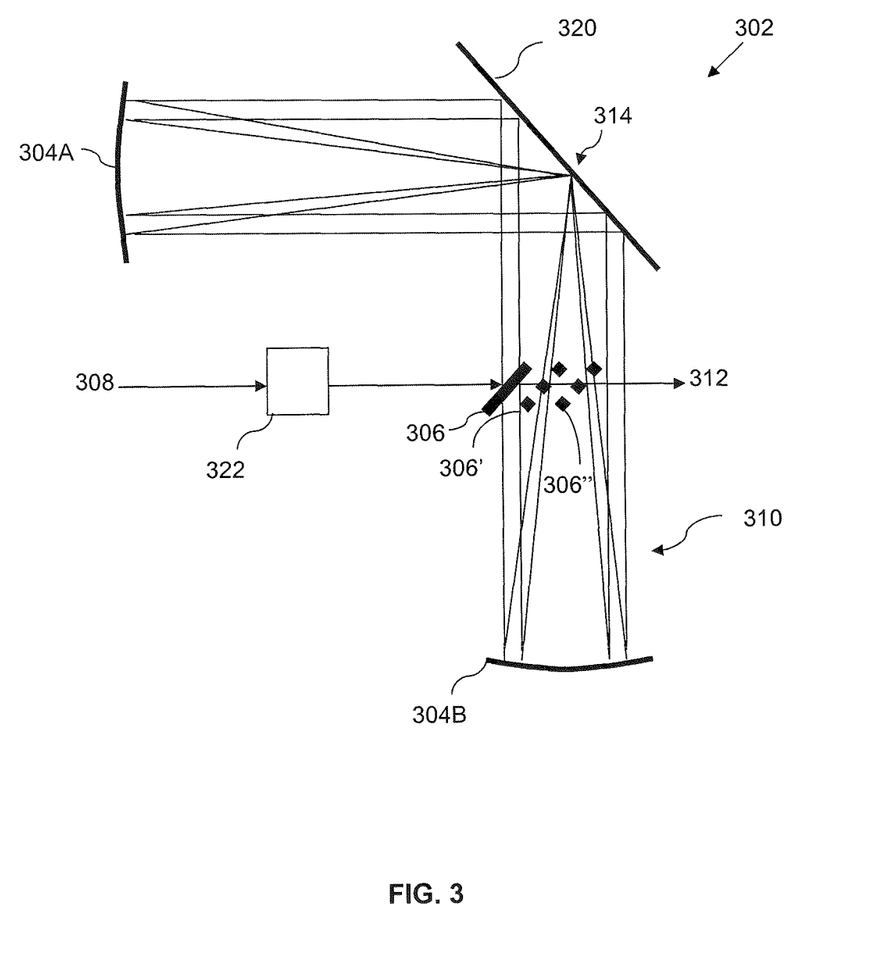
FIG. 3 depicts an exemplary folded pulse stretching device.

In order to obtain longer pulse stretching within packaging constraints, one or more fold mirrors can be used to bend the pulse stretcher cavity into two or more parts. FIG. 3 depicts an exemplary folded pulse stretching, or pulse modifying, device 302. Pulse stretcher 302 includes con-focal mirrors 304A/B and a beam stretcher 306 that are similar in function to con-focal mirrors 204A/B and beam stretcher 206 shown in FIG. 2. However, in FIG. 3, con-focal mirrors 304A and 304B are orthogonally arranged with a fold mirror 320 in an optical path between them. In this example, fold mirror 320 is approximately equidistant from con-focal mirror 304A and con-focal mirror 304B. However, it is not necessary for a fold mirror to be placed equidistant from the con-focal mirrors.

In the example shown in FIG. 3, an incoming beam 308 (e.g., an approximately collimated beam, a slightly diverging beam, etc.) enters pulse stretcher 302 along an optical axis of beam splitter 306. Optionally, beam 308 may be altered (e.g., made to slightly diverge or converge) by beam expander optics 322 prior to reaching beam splitter 306. An optical delay path 310 is formed by con-focal mirrors 304A/B and fold mirror 320 that is similar to optical delay path 210 as shown in FIG. 2, with the exception of the redirection by fold mirror 320. To create even longer pulse stretching, more than one beam splitter 306 can be used, e.g., by placing them in series as shown in FIG. 3.

In FIG. 3, three (3) beam splitters 306 are shown (306, 306', and 306"). Beam splitters 306' and 306" are shown as dotted lines to show that they are optional. Each beam splitter 306 directs a portion of its corresponding input beams to fold mirror 320 and con-focal mirrors 304A/B to create a desired optical delay. At least a portion of a beam leaving a beam splitter 306 is directed by a subsequent beam splitter 306 back to fold mirror 320 and con-focal mirrors 304A/B to create further optical delay. In FIG. 3, the optical delay paths caused by additional beam splitters 306' and 306" are not shown to maintain drawing clarity. Outgoing stretched pulse 312 exits the pulse stretcher beyond a final beam splitter 306. Any number of beam splitters 306 can be used, depending on how much stretching is desired. However, there is a potential power loss associated with each additional beam splitter, as would be understood by those skilled in the relevant art(s).

Figure 7A:
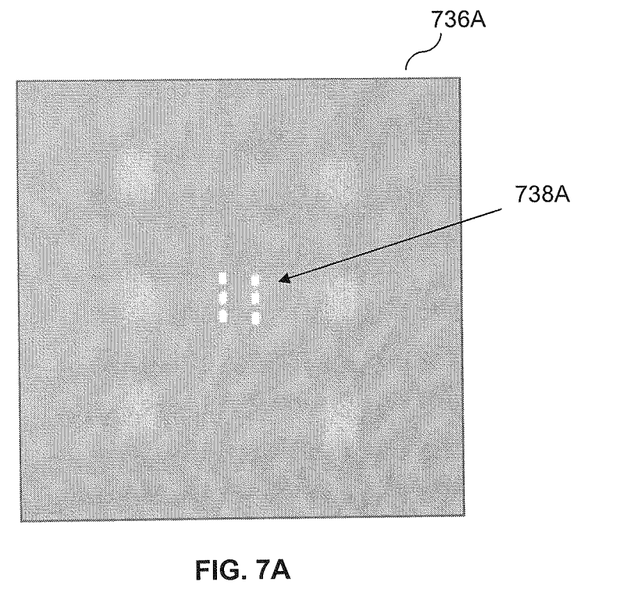
FIG. 7A shows an energy density footprint on a fold mirror such as found in the folded pulse stretching device shown in FIG. 3.

As shown in FIG. 3, a focal point 314 is formed by pulse stretcher 302. If focal point 314 is very near, or rests on, fold mirror 320 (a likely scenario considering packaging constraints), the high energy density at the focal point may damage fold mirror 320 depending on the total input energy. An example of this is shown in FIG. 7A. FIG. 7A shows an energy density footprint 736A on a fold mirror such as fold mirror 320 of the embodiment discussed with reference to FIG. 3. Energy density footprint 736A shows very concentrated energy (e.g., 130 mj/cm$^2$) in area 738A, indicating potential damage on fold mirror 320. For example, the light beams (e.g., ultraviolet light beams) incident on fold mirror 320 can react with gases causing spots, or burns, on fold mirror 320, which can greatly reduce the useful life of the fold mirror.

One way to reduce or prevent this damage would be to move the focal point away from the fold mirror. Ideally, this would be done without disturbing the packaging of the pulse stretcher. This can successfully be accomplished by introducing an overall divergence or convergence to the beam before it enters the pulse stretcher. In one embodiment, this can be done by adding an optical element before the pulse stretcher. In another embodiment, this can be done by modifying a beam expander already located before the pulse stretcher, such as optional beam expander optics 322.

Figure 4A:
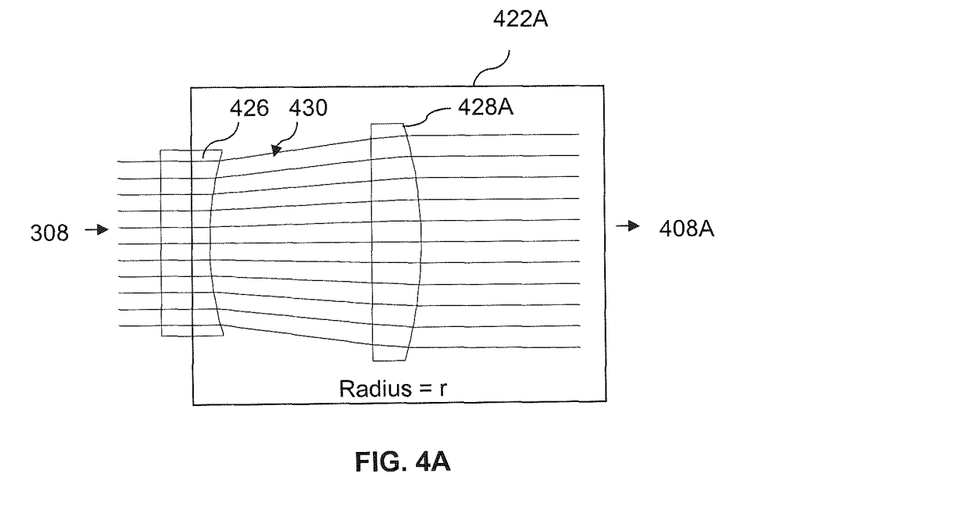
FIG. 4A depicts an exemplary beam expander.

FIG. 4A shows an example of a beam expander 422A, such as optional beam expander optics 322. A light pulse, or beam, such as beam 308 enters a concave lens 426 that causes beam 308 to diverge and exit concave lens 426 as a divergent beam 430. Divergent beam 430 enters convex lens 428A. Careful matching of radii of concave lens 426 and convex lens 428A (e.g., calibration of the curvature of convex lens 428A) causes powers to cancel, resulting in an approximately collimated output beam 408A of an increased size.

Figure 4B:
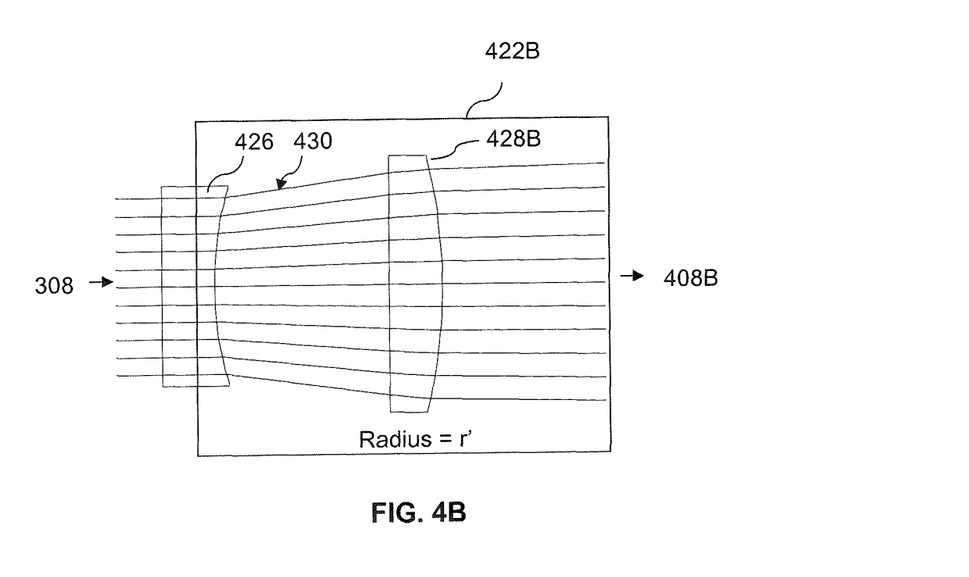
FIG. 4B depicts an exemplary beam expander that provides divergence.

By changing the radius of the convex lens, an intentional mismatch in powers can be caused, resulting in a beam that has a desired divergence or a convergence (depending on the desired calibration) as it leaves the beam expander. One example of this is shown in FIG. 4B, where beam expander 422B has a convex lens 428B having a radius r' that is different (in this example, larger) than radius r of convex lens 428A, causing slight divergence in outgoing beam 408B.

Figure 5:
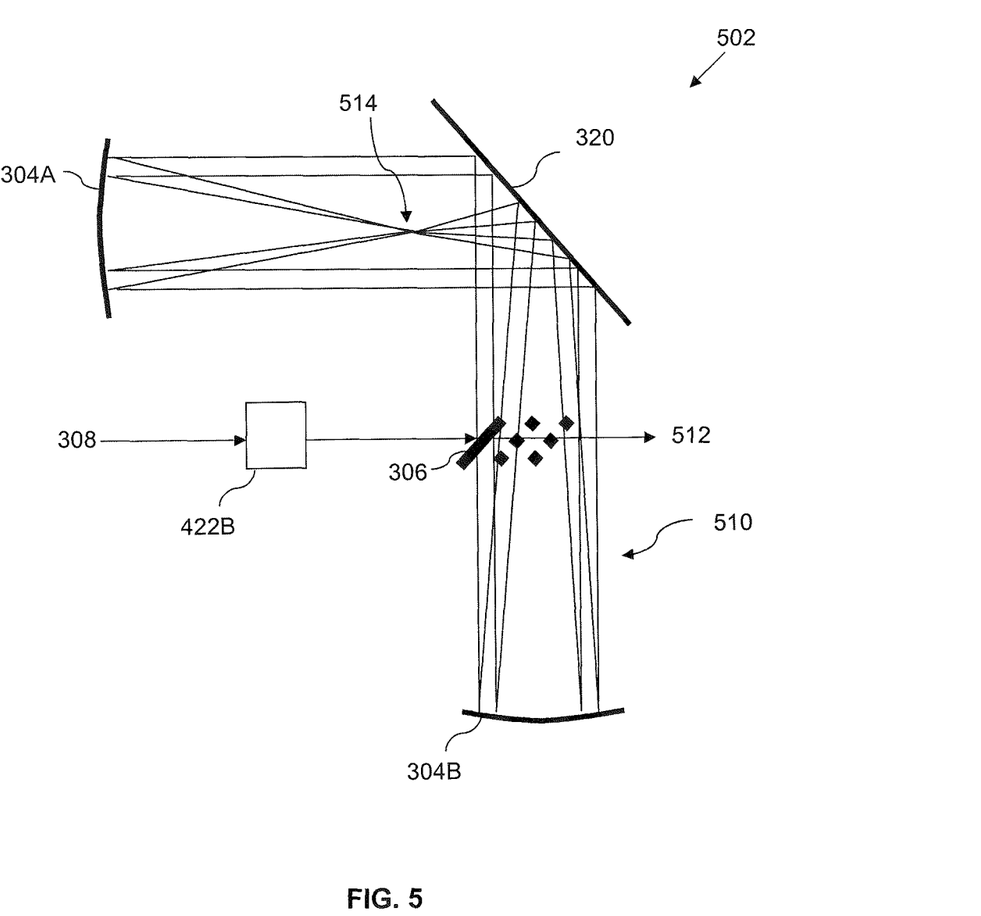
FIGS. 5 and 6 depict folded pulse stretching devices according to embodiments of the present invention.

Placement of optics, such as beam expander 422B, causing a desired divergence or convergence of a light beam in an optical path prior to a pulse stretcher can alter the location of the pulse stretcher's focal point. Or, alternatively, modification of an existing beam expander or other optics to cause the desired divergence or convergence can also be done for a similar effect. FIG. 5 shows an example of this, according to an embodiment of the present invention. In FIG. 5, beam expander 422B is placed prior to an initial beam splitter 306 of pulse stretcher 502. Beam expander 422B causes divergence of beam 308 such that a focal point 514 of pulse stretcher 502 is located away from fold mirror 320 and other optics in the device so as to reduce or prevent energy density related damage to those optics.

Figure 6:
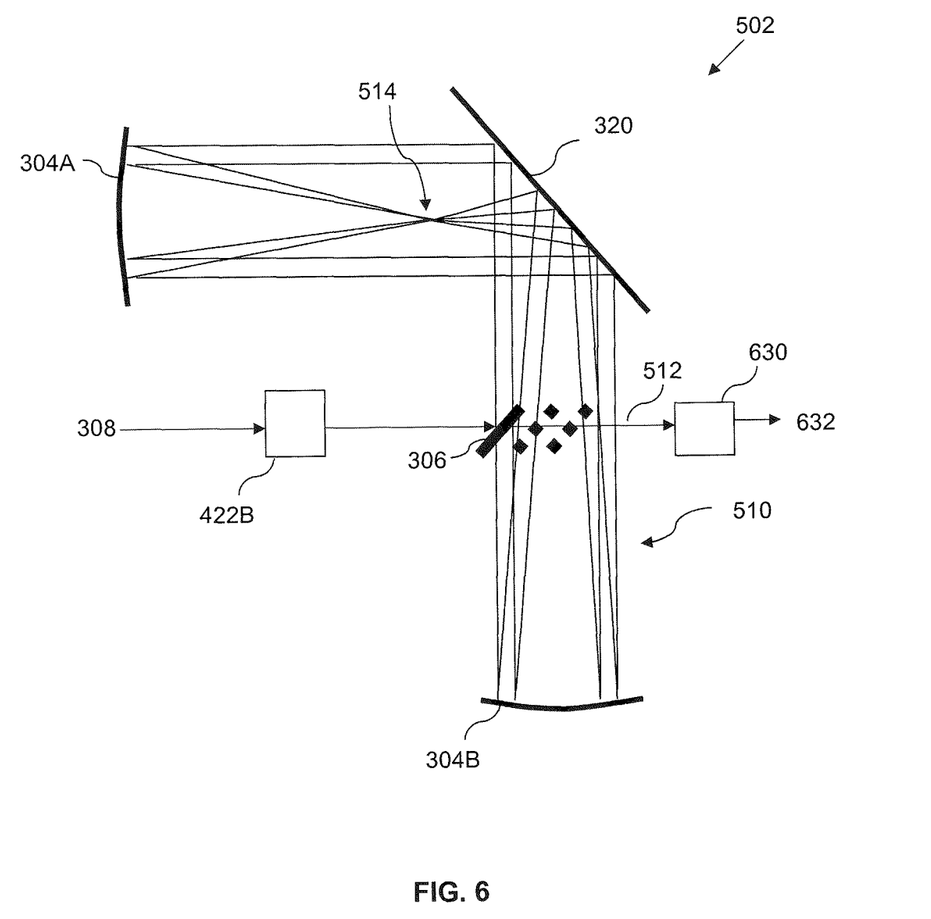

Beam 512 exits pulse stretcher 502 with the same length and energy it would have had without the divergence caused by beam expander 422B. However, beam 512 remains divergent. In an embodiment shown in FIG. 6, optics 630 can be configured in the optical path of beam 512 to re-condition the beam as desired into beam 632.

The embodiments discussed above with reference to FIGS. 5 and 6 involve using a beam expander, or modifying an existing beam expander, to cause divergence of an input beam. However, the invention is not to be limited to using, or modifying, a beam expander. Other embodiments using other optics or devices to cause the desired divergence (or convergence) of the input beam are also envisioned.

The embodiments discussed above with reference to FIGS. 5 and 6 involve creating divergence in an input beam to alter the location of a focal point of a pulse stretcher. However, the invention is not to be limited to creating a diverging input beam. As stated earlier, creating convergence in the input beam can have a similar effect. For example, in an embodiment, optics 422B in FIG. 5 could be replaced with a beam expander or optics that cause convergence of input beam 308. As an example, the radius of convex lens 428A in FIG. 4A can be changed to cause convergence, instead of divergence, of exiting beam 408A. Referring back to FIG. 5, in pulse stretcher 502, a converging beam can also shift focal point 514 away from fold mirror 320 and other optics in the device, protecting the optics from damage. Exiting beam 512 will still be converging, but optics 630 shown in FIG. 6 can be configured to re-condition the beam.

Further, the embodiments discussed above with reference to FIGS. 5 and 6 involve using a single fold mirror for pulse elongation. However, the invention is not to be limited to using a single fold mirror. In embodiments, two or more fold mirrors can also be used for further pulse elongation, and the embodiments described above can be used to prevent damage to any or all of the fold mirrors used in the device.

Figure 7B:
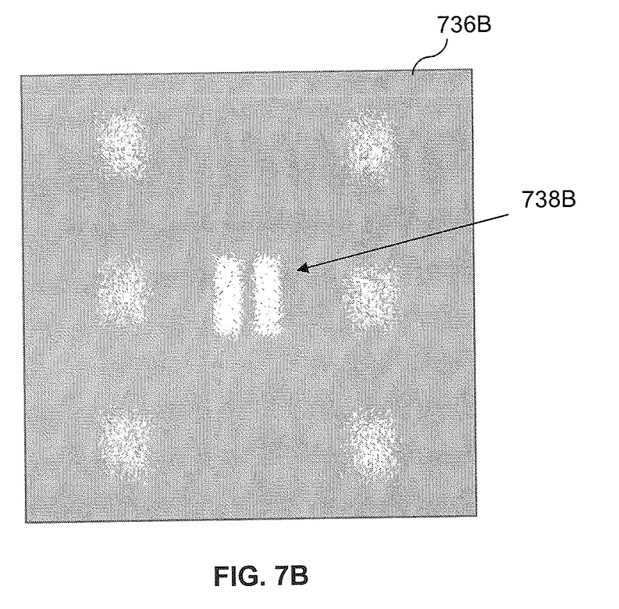
FIG. 7B shows an energy density footprint on a fold mirror such as found in the folded pulse stretching devices shown in FIGS. 5 and 6.

As described earlier, FIG. 7A shows an energy density footprint 736A on a fold mirror such as fold mirror 320 of the embodiment discussed with reference to FIG. 3. Energy density footprint 736A shows very concentrated energy (e.g., 130 mj/cm$^2$, depending on the strength of the laser and how close the focal point is to the fold mirror) in area 738A, indicating potential damage on fold mirror 320. FIG. 7B shows an energy density footprint 736B on a fold mirror such as fold mirror 320 of the embodiment discussed with reference to FIGS. 5 and 6. Energy density footprint 736B shows significantly less concentrated energy (e.g., 13 mj/cm$^2$) in area 738B. The reduction in energy density obtained by using the embodiments described with reference to FIGS. 5 and 6 can greatly reduce or prevent damage to fold mirror 320 and other optics within the system.

Figure 8:
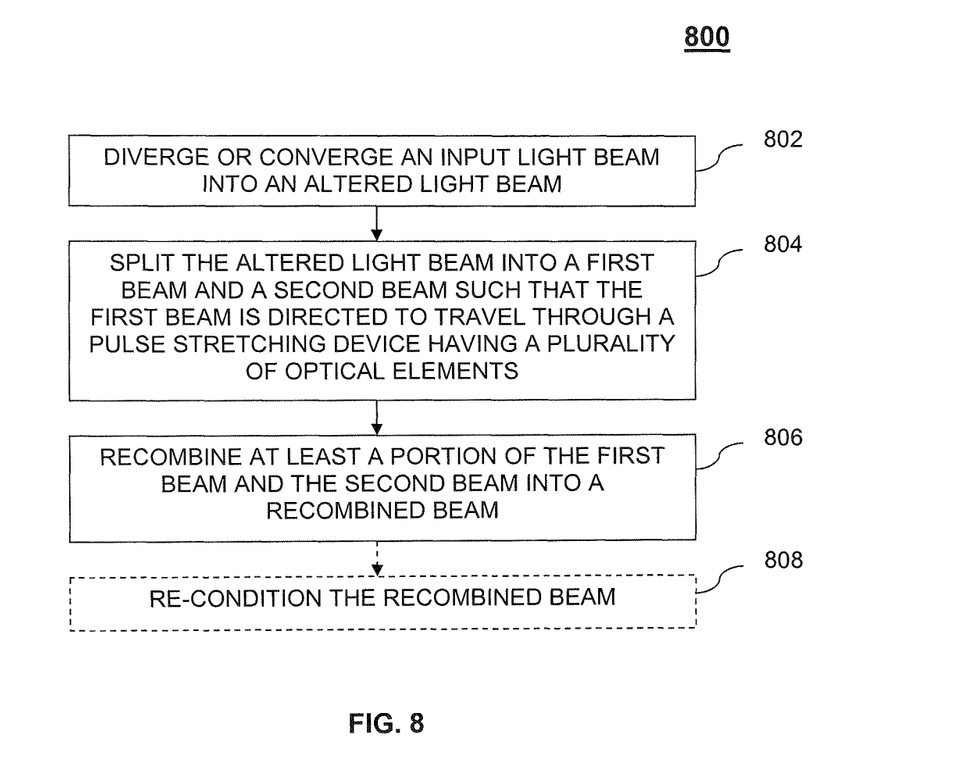
FIG. 8 is a flowchart depicting a method of increasing a pulse length of a pulsed laser beam, according to an embodiment of the present invention.

In accordance with the embodiments described above, FIG. 8 is a flowchart depicting a method 800 of increasing a pulse length of a pulsed laser beam, according to an embodiment of the present invention. In step 802, a light beam is made to diverge or converge as an altered light beam. In step 804, the altered light beam is split into a first beam and a second beam. The first beam is directed to travel through a pulse stretching device having a plurality of optical elements, such that the chosen divergence or convergence of the input light beam shifts a focal point of the pulse stretching device away from the plurality of optical elements. In step 806, at least a portion of the first beam and the second beam are recombined into a recombined beam. In optional step 808, the recombined beam is re-conditioned as desired.

Figure 9:
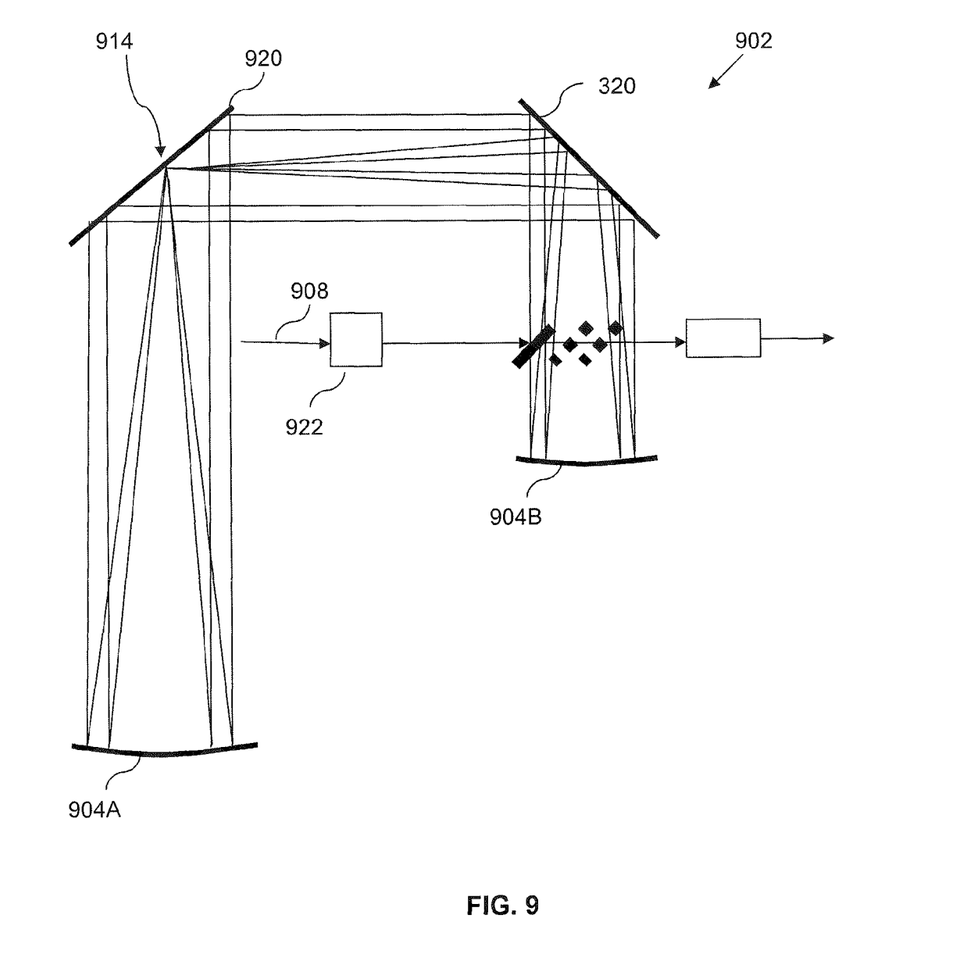
FIG. 9 depicts an exemplary folded pulse stretching device having two fold mirrors.

As stated earlier, more than one fold mirror may be used, for example to accommodate packaging constraints for longer pulse stretching. FIG. 9 depicts an exemplary folded pulse stretching device 902 having two fold mirrors. Folded pulse stretching device 902 is similar to folded pulse stretching device 302, except for the addition of fold mirror 920 in the optical path of the first beam, and the placement of confocal mirror 904A. As can be seen in FIG. 9, a focal point 914 is located at, or near, fold mirror 920. As in the embodiments discussed above, using an optical element, such as optical element 422B, in place of, or in addition to, optical element 922 to provide desired divergence or convergence of an input beam 908, focal point 914 can be moved away from fold mirror 920 to protect fold mirror 920 from potential damage. An example of this is shown in FIG. 10.

Figure 10:
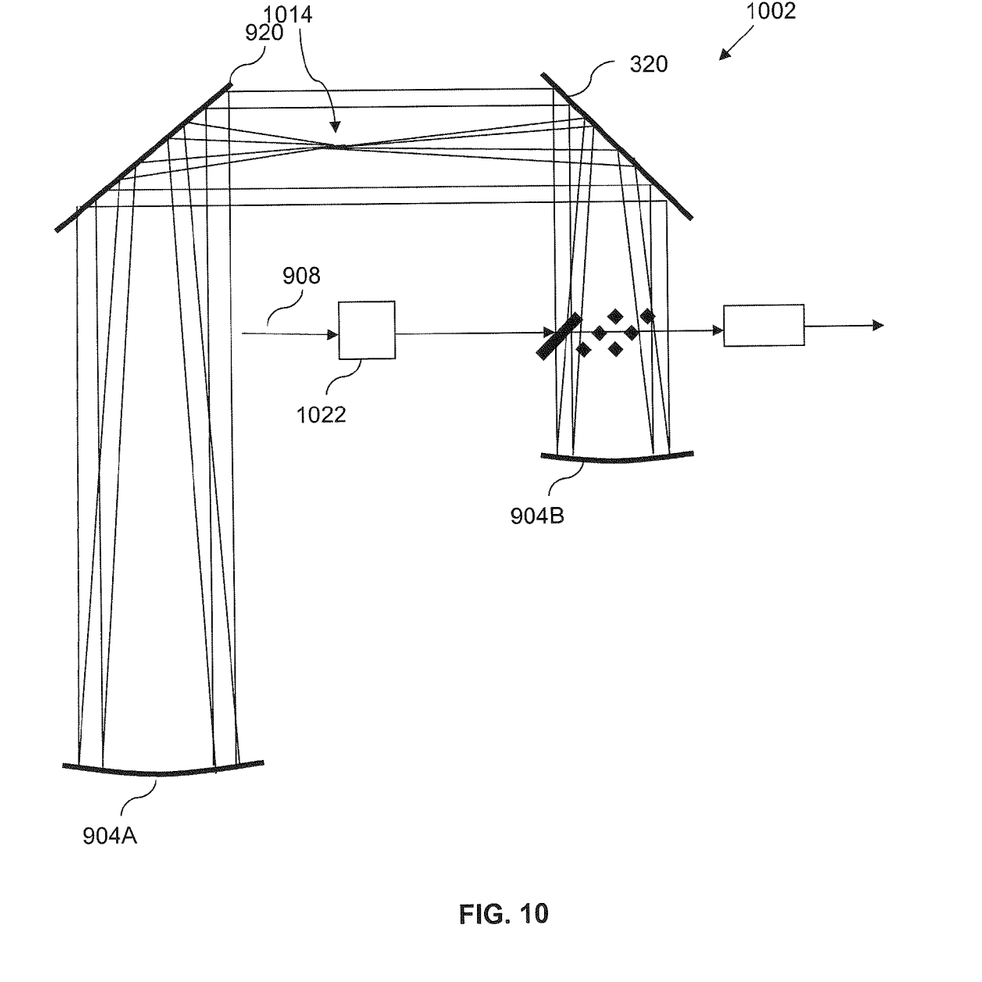
FIG. 10 depicts a folded pulse stretching device having two fold mirrors, according to an embodiment of the present invention.

FIG. 10 depicts a folded pulse stretching device 1002 having two fold mirrors, according to an embodiment. Folded pulse stretching device 1002 is similar to folded pulse stretching device 902, except that optical element 1022 is used to condition input beam 908 to a desired divergence or convergence in order to alter the location of the focal point, similar to the effect optical element 422B provides in the embodiments shown in FIGS. 5 and 6. As can be seen in FIG. 10, the divergence or convergence provided by optical element 1022 places a focal point 1014 away from fold mirror 920, protecting it from potential damage.

The foregoing description presents a pulse stretcher with reduced energy density on its optical components. It allows a pulse stretcher to provide a longer stretch by allowing one or more fold mirrors to be used without damage caused by a high energy density at a focal point of the device. This is achieved by controlling the input divergence or convergence of the input beam to the pulse stretcher.

Although the examples provided in this text involve pulse stretching devices, it should be understood that the features of this invention can be applied to other similar optical systems (e.g., similar one-to-one imaging systems).

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

The terms "radiation" and "beam" used herein encompass all types of electromagnetic radiation, including ultraviolet (UV) radiation (e.g., having a wavelength of or about 365, 355, 248, 193, 157 or 126 nm).

The terms "optics" or "lens", where the context allows, may refer to any one or combination of various types of optical components, including refractive, reflective, magnetic, electromagnetic and electrostatic optical components.

While specific embodiments of the invention have been described above, it will be appreciated that the invention may be practiced otherwise than as described.

Conclusion

It is to be appreciated that the Detailed Description section, and not the Summary and Abstract sections, is intended to be used to interpret the claims. The Summary and Abstract sections may set forth one or more but not all exemplary embodiments of the present invention as contemplated by the inventor(s), and thus, are not intended to limit the present invention and the appended claims in any way.

Embodiments of the present invention have been described above with the aid of functional building blocks illustrating the implementation of specified functions and relationships thereof. The boundaries of these functional building blocks have been arbitrarily defined herein for the convenience of the description. Alternate boundaries can be defined so long as the specified functions and relationships thereof are appropriately performed.

The foregoing description of the specific embodiments will so fully reveal the general nature of the invention that others can, by applying knowledge within the skill of the art, readily modify and/or adapt for various applications such specific embodiments, without undue experimentation, without departing from the general concept of the present invention. Therefore, such adaptations and modifications are intended to be within the meaning and range of equivalents of the disclosed embodiments, based on the teaching and guidance presented herein. It is to be understood that the phraseology or terminology herein is for the purpose of description and not of limitation, such that the terminology or phraseology of the present specification is to be interpreted by the skilled artisan in light of the teachings and guidance.

The breadth and scope of the present invention should not be limited by any of the above-described exemplary embodiments, but should be defined only in accordance with the following claims and their equivalents.

What is claimed is:

1. An apparatus for increasing a pulse length of a pulsed laser beam, comprising:
    a beam splitter configured to split an input light beam into a first beam and a second beam;
    a con-focal resonator including a first con-focal mirror and a second con-focal mirror;
    a fold mirror in an optical path between the first and second con-focal mirrors, the fold mirror being configured to redirect the first beam or at least a portion of the first beam between the first and second con-focal mirrors,
    wherein the beam splitter, the con-focal resonator, and the fold mirror are in an optical arrangement such that at least a portion of the first beam is recombined with the second beam into a modified beam after an optical delay of the first beam caused by the optical arrangement; and
    an optical element in an optical path of the input light beam prior to the beam splitter, wherein the optical element is configured to form an intermediate focal point of the first beam at a distance away from the fold mirror, in order to reduce energy density-related damage to the fold mirror.

2. The apparatus of claim 1, wherein the fold mirror is approximately equidistant between the first and second con-focal mirrors.

3. The apparatus of claim 1, wherein the optical element is configured to provide divergence or convergence of the input light beam prior to the splitting of the input light beam by the beam splitter.

4. The apparatus of claim 1, further comprising additional optical elements in an optical path of the modified beam, wherein the additional optical elements are configured to provide re-conditioning of the modified beam.

5. The apparatus of claim 1, wherein the bean splitter, the con-focal resonator, the fold mirror, and the optical element comprise a beam delivery system of a lithography apparatus.

6. The apparatus of claim 1, further comprising additional beam splitters in series with the beam splitter, each of the additional beam splitters configured to direct an additional first beam through the optical arrangement to produce additional optical delay.

7. The apparatus of claim 1, wherein the fold mirror comprises a plurality of fold mirrors.

8. A lithography apparatus comprising a beam delivery system having a pulse stretcher for increasing a pulse length of a pulsed laser beam, the pulse stretcher comprising:
   a beam splitter configured to split an input light beam into a first beam and a second beam;
   a con-focal resonator including a first con-focal mirror and a second con-focal mirror;
   a fold mirror in an optical path between the first and second con-focal mirrors, the fold mirror being configured to redirect the first beam or at least a portion of the first beam between the first and second con-focal mirrors,
   wherein the beam splitter, the con-focal resonator, and the fold mirror are in an optical arrangement such that at least a portion of the first beam is recombined with the second beam into a modified beam after an optical delay of the first beam caused by the optical arrangement; and
   an optical element in an optical path of the input light beam prior to the beam splitter, wherein the optical element is configured to form an intermediate focal point of the first beam at a distance away from the fold mirror, in order to reduce energy density-related damage to the fold mirror.

9. The lithography apparatus of claim 8, further comprising:
   an illumination system configured to condition the modified beam;
   a patterning device support configured to support a patterning device, the patterning device configured to impart the modified beam with a pattern in its cross-section to form a patterned radiation beam;
   a substrate support configured to hold a substrate; and
   a projection system configured to project the patterned radiation beam onto a target portion of the substrate.

10. The lithography apparatus of claim 8, wherein the fold mirror is approximately equidistant between the first and second con-focal mirrors.

11. The lithography apparatus of claim 8, wherein the optical element is configured to provide divergence or convergence of the input light beam prior to the splitting of the input light beam by the beam splitter.

12. The lithography apparatus of claim 8, further comprising additional optical elements in an optical path of the modified beam, wherein the additional optical elements are configured to provide re-conditioning of the modified beam.

13. The lithography apparatus of claim 8, further comprising additional beam splitters in series with the beam splitter, each of the additional beam splitters configured to direct an additional first beam through the optical arrangement to produce additional optical delay.

14. The lithography apparatus of claim 8, wherein the fold mirror comprises a plurality of fold mirrors.

15. A method of increasing a pulse length of a pulsed laser beam, the method comprising:
   diverging or converging an input light beam into an altered light beam;
   splitting the altered light beam into a first beam and a second beam such that the first beam is directed to travel through a pulse stretching device having a plurality of optical elements,
   wherein the divergence or convergence of the input light beam shifts an intermediate focal point of the first beam away from any of the plurality of optical elements;
   redirecting, using a fold mirror, the first beam or at least a portion of the first beam between a first con-focal mirror and a second con-focal mirror,
   wherein the fold mirror is positioned in an optical path between the first and second con-focal mirrors; and
   recombining at least a portion of the first beam with the second beam into a recombined beam.

16. The method of claim 15, further comprising re-conditioning the recombined beam.

17. A device for increasing a pulse length of a pulsed laser beam, the device comprising:
   a beam splitter configured to split an input light beam into a first beam and a second beam;
   a fold mirror in an optical path between a first con-focal mirror and a second con-focal mirror, the fold mirror being configured to redirect the first beam or at least a portion of the first beam between the first and second con-focal mirrors; and
   an optical element disposed in an optical path of the input light beam, the optical element configured to provide divergence or convergence of the input light beam such that an intermediate focal point of the first beam is formed at a distance away from a focal point that is otherwise formed on the fold mirror without the divergence or convergence, in order to reduce energy density-related damage to the fold mirror.

* * * * *

UNITED STATES PATENT AND TRADEMARK OFFICE
CERTIFICATE OF CORRECTION

| | | |
|---|---|---|
| PATENT NO. | : 8,610,874 B2 | Page 1 of 1 |
| APPLICATION NO. | : 12/768096 | |
| DATED | : December 17, 2013 | |
| INVENTOR(S) | : Venkataraman et al. | |

It is certified that error appears in the above-identified patent and that said Letters Patent is hereby corrected as shown below:

In the Claims

Column 13, claim 5, line 3, after "the" delete "bean" and insert -- beam --.

Signed and Sealed this
Twentieth Day of May, 2014

Michelle K. Lee
*Deputy Director of the United States Patent and Trademark Office*